(12) United States Patent
Thirunavukarasu et al.

(10) Patent No.: US 10,847,400 B2
(45) Date of Patent: Nov. 24, 2020

(54) ADHESIVE-LESS SUBSTRATE BONDING TO CARRIER PLATE

(71) Applicant: APPLIED MATERIALS, INC., Santa Clara, CA (US)

(72) Inventors: Sriskantharajah Thirunavukarasu, Singapore (SG); Arvind Sundarrajan, Singapore (SG); Karrthik Parathithasan, Singapore (SG); Qi Jie Peng, Singapore (SG); Manorajh Arunakiri, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/286,273

(22) Filed: Feb. 26, 2019

(65) Prior Publication Data
US 2020/0211883 A1 Jul. 2, 2020

Related U.S. Application Data

(60) Provisional application No. 62/785,781, filed on Dec. 28, 2018.

(51) Int. Cl.
*H01L 21/56* (2006.01)
*H01L 21/48* (2006.01)
*H01L 21/683* (2006.01)

(52) U.S. Cl.
CPC ...... *H01L 21/6831* (2013.01); *H01L 21/4857* (2013.01); *H01L 21/561* (2013.01); *H01L 21/6835* (2013.01)

(58) Field of Classification Search
CPC ............ H01L 21/6831; H01L 21/4857; H01L 21/561; H01L 21/6835
See application file for complete search history.

(56) References Cited

U.S. PATENT DOCUMENTS

| 5,403,700 | A | 4/1995 | Heller et al. |
| 5,411,795 | A | 5/1995 | Silverman |
| 7,258,520 | B2 | 8/2007 | Elliott et al. |
| 8,680,692 | B2 | 3/2014 | Chang et al. |
| 2006/0046350 | A1* | 3/2006 | Jiang ................ H01L 23/49816 438/114 |
| 2007/0044303 | A1* | 3/2007 | Yamano ............. H01L 21/4857 29/830 |
| 2010/0187002 | A1 | 7/2010 | Lee et al. |
| 2016/0307871 | A1 | 10/2016 | Tsai et al. |
| 2016/0336233 | A1 | 11/2016 | Yonehara et al. |
| 2017/0154866 | A1 | 6/2017 | Fathi et al. |
| 2019/0311916 | A1 | 10/2019 | Chavali et al. |

OTHER PUBLICATIONS

PCT International Search Report and Written opinion for PCT/US2019/068832 filed Apr. 29, 2020.

* cited by examiner

*Primary Examiner* — Kyoung Lee
(74) *Attorney, Agent, or Firm* — Moser Taboada

(57) ABSTRACT

Methods for bonding and de-bonding a thin substrate film to a carrier plate are provided herein. In some embodiments, a method of processing a semiconductor substrate includes applying a polymer layer that is non-adhesive to a carrier plate formed of a dielectric material. A second layer is then applied to the polymer layer. One or more redistribution layers are then formed on the second layer. The second layer is then separated from the carrier plate via at least one of magnetic induction heating, infrared exposure, or electrostatic repulsion.

20 Claims, 3 Drawing Sheets

ADHESIVE-LESS SUBSTRATE BONDING TO CARRIER PLATE

CROSS-REFERENCE TO RELATED APPLICATIONS

This application claims benefit of United States provisional patent application Ser. No. 62/785,781, filed Dec. 28, 2018, which is herein incorporated by reference in its entirety.

FIELD

Embodiments of the present principles generally relate to semiconductor processes used in packaging semiconductor devices.

BACKGROUND

A semiconductor substrate is processed to form structures on the substrate surface. The structures on a particular region of the substrate can be linked together to form a microcircuit. The substrate may have many different microcircuits constructed on the substrate's surface during processing. Once the substrate has finished being processed, the substrate is cut apart or singulated to separate the microcircuits into semiconductor 'chips', or dies. The substrate goes through numerous processes before the final chip is developed. Some of these processes include physical vapor deposition (PVD), lithography, and thermal curing.

The chips often contain complex circuitry which needs to interact with external components. The chip's internal circuitry is too minute to be connected directly to the external components. To overcome the external connection issues, lead outs are formed that are connected to the internal circuitry of a chip to a pad or solder ball that allows for external connections. The lead outs are formed in what is known as a redistribution layer during follow-on package processing of the semiconductor chips. Prior to these processes, the substrate undergoes a temporary bonding process. Typically, the temporary bonding process includes dispensing an adhesive in liquid form onto a glass carrier, followed by attaching a thin substrate film onto the adhesion surface before undergoing compression and thermal curing. Once the bonded substrate has completed the production processes, the substrate is released from the glass carrier via ultraviolet or laser methods that decompose the cured adhesive. However, the temporary bonding and de-bonding is expensive and time consuming. In addition, the techniques that use a temporary carrier also require additional processing steps that add to the costs and decrease the throughput for redistribution layer processes.

Accordingly, the inventors have provided improved methods and apparatus for bonding and de-bonding a thin substrate film to a carrier.

SUMMARY

Methods for bonding and de-bonding a thin substrate film to a carrier plate are provided herein. In some embodiments, a method of processing a semiconductor substrate includes applying a polymer layer that is non-adhesive to a carrier plate formed of a dielectric material; applying a second layer to the polymer layer; forming one or more redistribution layers on the second layer; and separating the second layer from the carrier plate via at least one of magnetic induction heating, infrared exposure, or electrostatic repulsion.

In some embodiments, a method of forming a package includes applying an interface layer that is non-adhesive to a carrier plate formed of a dielectric material; forming one or more redistribution layers on the interface layer; coupling an integrated circuit to the one or more redistribution layers; and separating the one or more redistribution layers and the integrated circuit from the carrier plate via at least one of magnetic induction heating, infrared exposure, or electrostatic repulsion.

In some embodiments, a method of processing a semiconductor substrate includes applying an interface layer that is non-adhesive to a dielectric carrier plate, wherein the interface layer includes a first polymer layer and a second layer; forming one or more redistribution layers on the second layer; separating the second layer from the dielectric carrier plate via at least one of magnetic induction heating, infrared exposure, or electrostatic repulsion; and removing at least one of the first polymer layer and the second layer from the one or more redistribution layers.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
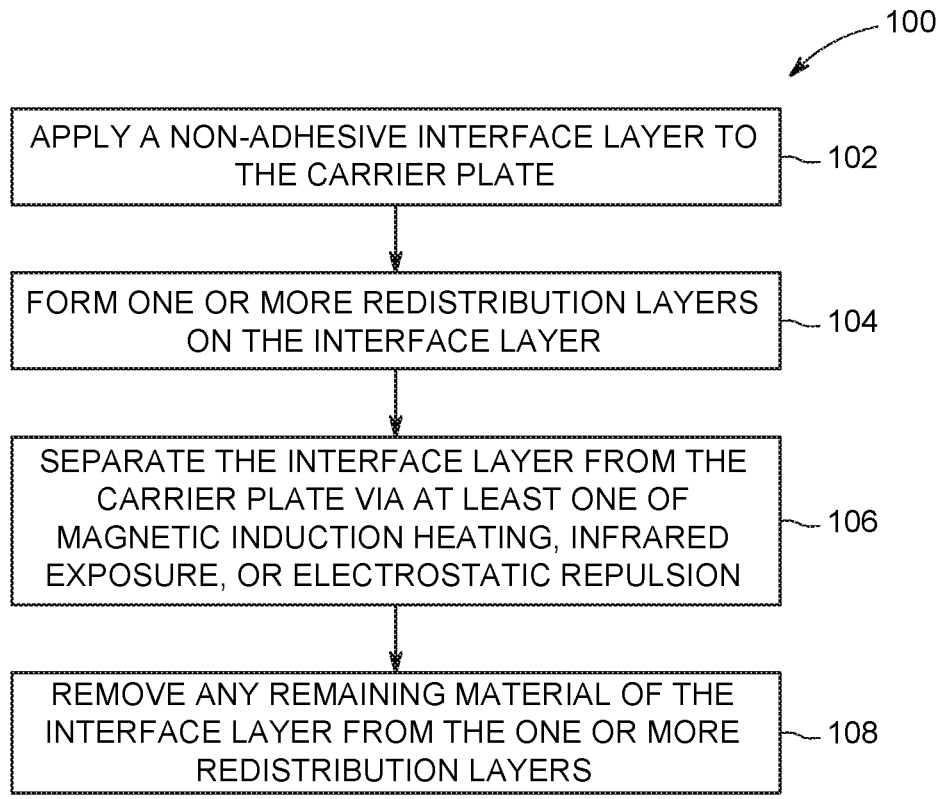
FIG. 1 is a method of bonding and de-bonding a thin substrate film to a carrier plate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

A semiconductor package is a metal, plastic, glass or ceramic casing containing one or more semiconductor electronic components. Fan Out Wafer Level Packaging (FOWLP) is an advanced semiconductor packaging adopted by the semiconductor industry. FOWLP packaging includes redistribution layers formed on a substrate. The substrate consists of a carrier plate bonded to a thin substrate film. In some embodiments, the carrier plate has an outer diameter of about 12 inches. Integrated circuit chips are then coupled to the one or more redistribution layers. Then, the integrated circuit chips are encapsulated with an epoxy mold compound. These series of processes can be repeated again to complete an upper portion of the package assembly. Finally, the package assembly is released, or de-bonded, from the carrier plate via a variety of methods such as infrared exposure, magnetic induction heating, or electrostatic repulsion.

Figure 2A:
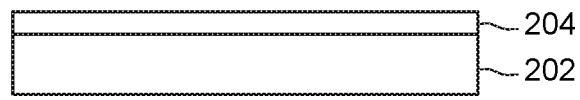
FIGS. 2A-2F depict stages of a process to bond and de-bond a thin substrate film to a carrier plate in accordance with some embodiments of the present disclosure.
Figure 2B:
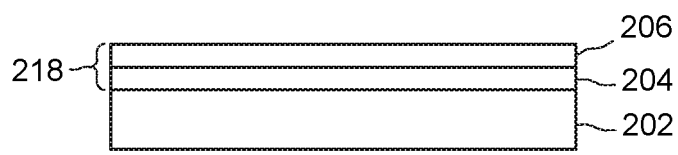

FIG. 1 is a method of bonding and de-bonding a thin substrate film to a carrier plate in accordance with some embodiments of the present disclosure. The method 100 starts at 102 by applying a non-adhesive interface layer to the carrier plate. The interface layer advantageously provides low outgas, high thermal stability, high chemical resistance, and high bonding strength. In some embodiments, as shown in FIGS. 2A-2B, an interface layer 218 includes a polymer layer 204 and a second layer 206. The polymer layer 204 is non-adhesive and applied to a carrier plate 202. In some embodiments, the carrier plate 202 is coated with the polymer layer 204 and then subsequently cured. In some embodiments, the carrier plate 202 is formed of a dielectric material. In some embodiments, the carrier plate 202 comprises silicon. In some embodiments, the polymer layer 204 comprises poly-dimethylsiloxane (PDMS), poly-di-methyl-siloxane (PDMS), or the like, doped with nanoparticles. The nanoparticles are configured to generate heat when the nanoparticles are exposed to magnetic induction heating or infrared exposure. The second layer 206 is deposited on the polymer layer 204. In some embodiments, the second layer 206 is a substantially pure poly-dimethylsiloxane (PDMS) layer or pure poly-di-methyl-siloxane (PDMS) layer.

Figure 3A:
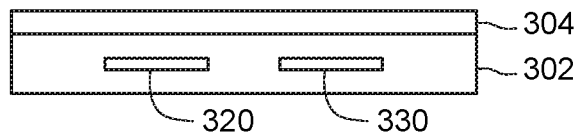
FIGS. 3A-3F depict stages of a process to bond and de-bond a thin substrate film to a carrier plate in accordance with some embodiments of the present disclosure.
Figure 3B:
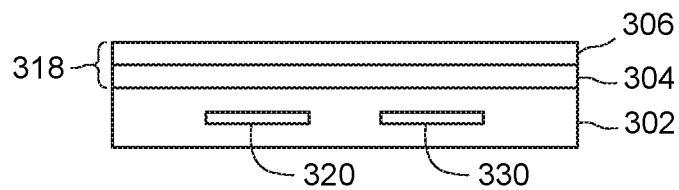

In some embodiments, as shown in FIGS. 3A-3B, an interface layer 318 includes a polymer layer 304 and a second layer 306. The polymer layer 304 is non-adhesive and applied to a carrier plate 302. The carrier plate 302 is configured as an electrostatic chuck including electrodes such as a first electrode 320 and a second electrode 330 embedded in the carrier plate 302. In some embodiments, the carrier plate 302 comprises a ceramic material. In some embodiments, the polymer layer 304 comprises a semi-electrically conductive polymer film. The second layer 306 is formed of a conductive material. In some embodiments, the second layer 306 is a copper layer. The polymer layer 304 advantageously helps to bond the second layer 306 to the carrier plate 302. In operation, the first electrode 320 and the second electrode 330 of the carrier plate 302 are charged to induce an electrostatic attraction force between the carrier plate 302 and the second layer 306. The charges of the first electrode 320 and the second electrode 330 have opposite polarities to electrostatically clamp, or bond, the second layer 306 to the carrier plate 302. For example the first electrode 320 may have a positive polarity while the second electrode 330 has a negative polarity.

Figure 2C:
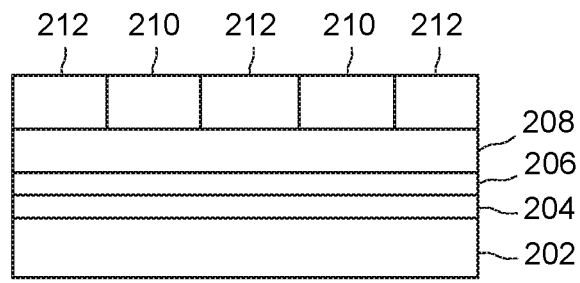
Figure 3C:
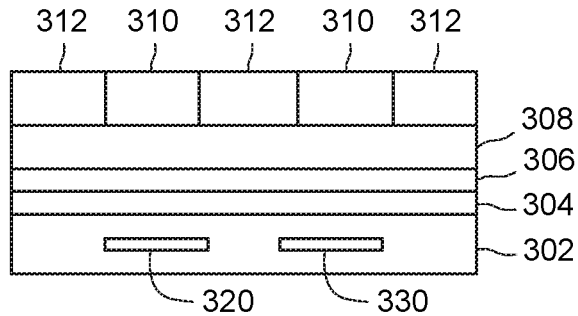

The method continues at 104 by forming one or more redistribution layers on the interface layer 218. In some embodiments, as shown in FIG. 2C, one or more redistribution layers 208 are formed on the second layer 206. In some embodiments, integrated circuit chips 210 are coupled to the one or more redistribution layers 208. The integrated circuit chips 210 are encapsulated with an epoxy mold compound 212. In some embodiments, as shown in FIG. 3C, one or more redistribution layers 308 are formed on the second layer 306. In some embodiments, integrated circuit chips 310 are coupled to the one or more redistribution layers 308. The integrated circuit chips 310 are encapsulated with an epoxy mold compound 312.

Figure 2D:
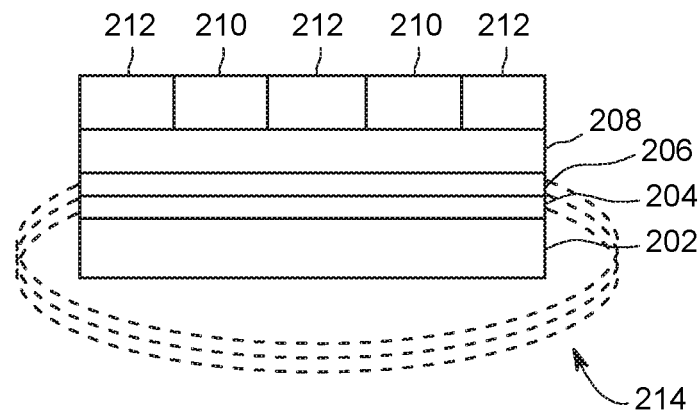
Figure 2E:
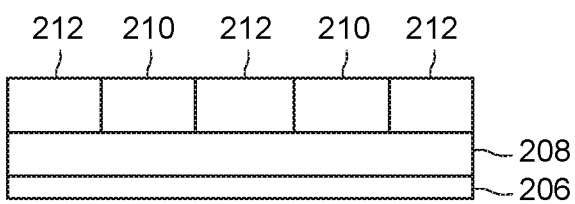
Figure 2E:
Figure 2F:
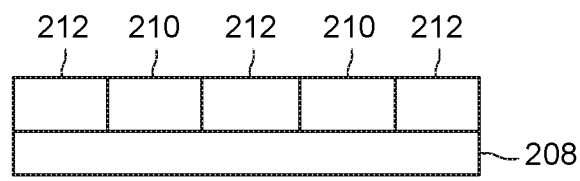

The method continues at 106 by separating the second layer from the carrier plate via at least one of magnetic induction heating, infrared exposure, or electrostatic repulsion. In some embodiments, as shown in FIG. 2D, a magnetic field 214 is applied to the interface layer 218. The magnetic field 214 may be generated by a permanent magnet, an electromagnet, or the like. The magnetic field 214 is advantageously localized to target heating of nanoparticles that are embedded in the polymer layer 204. The magnetic field 214 is configured to not thermally impact the one or more redistribution layers 208. In some embodiments, the nanoparticles are configured to generate heat when the nanoparticles are exposed to magnetic induction heating. In some embodiments, as shown in FIG. 2E, the heating of the nanoparticles separates the second layer 206 from the polymer layer 204 and the carrier plate 202. In some embodiments, the second layer 206 is exposed to infrared radiation to heat the nanoparticles to separate the second layer 206 from the polymer layer 204 and the carrier plate 202.

Figure 3D:
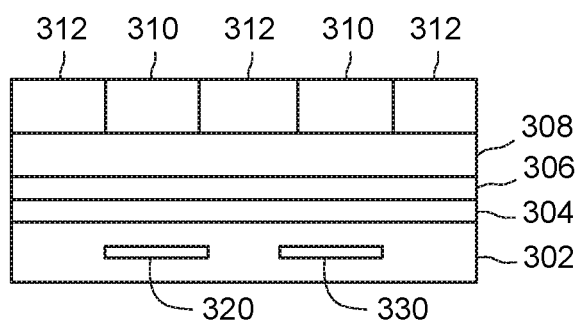
Figure 3E:
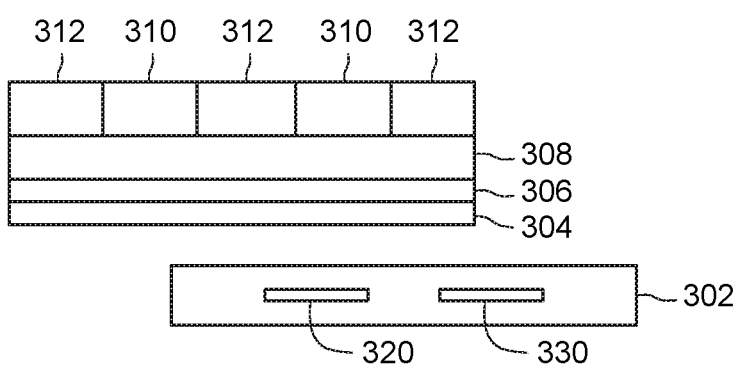
Figure 3F:
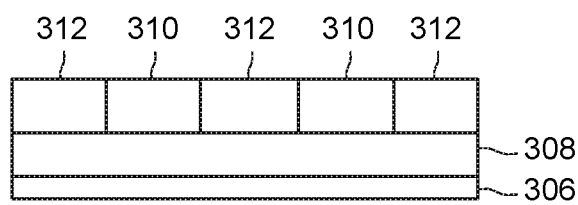

In some embodiments, as shown in FIGS. 3D-3E, the first electrode 320 and the second electrode 330 of the carrier plate 302 are charged to induce an electrostatic repulsion force between the carrier plate 302 and the second layer 306. The charges of the first electrode 320 and the second electrode 330 have the same polarity as the charges of the second layer 306 to separate, or de-bond, the second layer 306 from the carrier plate 302. For example the first electrode 320 and the second electrode 330 may both have a positive. In some embodiments, heat is applied to the interface layer 318 to enhance the de-bonding process.

The method continues at 108 by removing any remaining material of the interface layer from the one or more redistribution layers. In some embodiments, as shown in 2F, the second layer 206 is removed from the one or more redistribution layer 208. In some embodiments, the second layer 206 may be removed by peeling. In some embodiments, the second layer 206 may be removed via a chemical process. In some embodiments, as shown in 3F, the polymer layer 304 is removed from the one or more redistribution layer 208. In some embodiments, the polymer layer 304 may be removed by peeling. In some embodiments, the polymer layer 304 may be removed via a chemical process.

While the foregoing is directed to embodiments of the present disclosure, other and further embodiments of the disclosure may be devised without departing from the basic scope thereof.

The invention claimed is:

1. A method of processing a semiconductor substrate, comprising:
  applying a polymer layer that is non-adhesive to a carrier plate formed of a dielectric material;
  applying a second layer to the polymer layer;
  forming one or more redistribution layers on the second layer; and
  separating the second layer from the carrier plate via at least one of magnetic induction heating, infrared exposure, or electrostatic repulsion.

2. The method of claim 1, wherein the carrier plate is configured as a electrostatic chuck including electrodes embedded in the carrier plate and the polymer layer comprises a semi-electrically conductive polymer film, and further comprising inducing an electrostatic attraction force between the carrier plate and the second layer prior to forming the one or more redistribution layers.

3. The method of claim 2, wherein the second layer is a copper layer.

4. The method of claim 2, further comprising storing charges having opposite polarities in the electrodes to electrostatically clamp the second layer to the carrier plate prior to forming the one or more redistribution layers.

5. The method of claim 4, further comprising applying a charge having the same polarity to the electrodes and to the second layer to separate the second layer from the carrier plate.

6. The method of claim 1, wherein both the polymer layer and the second layer comprises poly-dimethylsiloxane (PDMS).

7. The method of claim 6, wherein the polymer layer comprises poly-dimethylsiloxane (PDMS) doped with nanoparticles configured to generate heat when the nanoparticles are exposed to magnetic induction heating or infrared exposure.

8. The method of claim 1, wherein the carrier plate comprises silicon.

9. The method of claim 1, wherein the polymer layer comprises poly-dimethylsiloxane (PDMS) doped with nanoparticles configured to generate heat when the nanoparticles are exposed to magnetic induction heating or infrared exposure, wherein the second layer is a substantially pure poly-dimethylsiloxane (PDMS) layer, and wherein the second layer is separated from the polymer layer and the carrier plate via at least one of magnetic induction heating or infrared exposure to heat the nanoparticles.

10. A method of forming a package comprising:
    applying an interface layer that is non-adhesive to a carrier plate formed of a dielectric material;
    forming one or more redistribution layers on the interface layer;
    coupling an integrated circuit to the one or more redistribution layers; and
    separating the one or more redistribution layers and the integrated circuit from the carrier plate via at least one of magnetic induction heating, infrared exposure, or electrostatic repulsion.

11. The method of claim 10, wherein applying the interface layer to the carrier plate comprises applying a first polymer layer to the carrier plate and applying a second layer to the first polymer layer.

12. The method of claim 11, wherein the second layer is a copper layer.

13. The method of claim 11, wherein both the polymer layer and the second layer comprises poly-dimethylsiloxane (PDMS).

14. The method of claim 13, wherein the first polymer layer comprises poly-dimethylsiloxane (PDMS) doped with nanoparticles configured to generate heat when the nanoparticles are exposed to magnetic induction heating or infrared exposure.

15. The method of claim 10, wherein the carrier plate is configured as a electrostatic chuck including electrodes embedded in the carrier plate and the interface layer comprises a semi-electrically conductive polymer film, and further comprising inducing an electrostatic attraction force between the carrier plate and the interface layer prior to forming the one or more redistribution layers.

16. The method of claim 15, further comprising storing charges having opposite polarities in the electrodes to electrostatically clamp the interface layer to the carrier plate prior to forming the one or more redistribution layers.

17. The method of claim 16, further comprising applying a charge having the same polarity to the electrodes and to the interface layer to separate the interface layer from the carrier plate.

18. A method of processing a semiconductor substrate, comprising:
    applying an interface layer that is non-adhesive to a dielectric carder plate, wherein the interface layer includes a first polymer layer and a second layer;
    forming one or more redistribution layers on the second layer;
    separating the second layer from the dielectric carrier plate via at least one of magnetic induction heating, infrared exposure, or electrostatic repulsion; and
    removing at least one of the first polymer layer and the second layer from the one or more redistribution layers.

19. The method of claim 18, wherein the first polymer layer comprises poly-dimethylsiloxane (PDMS) doped with nanoparticles configured to generate heat when the nanoparticles are exposed to magnetic induction heating or infrared exposure.

20. The method of claim 18, wherein the dielectric carrier plate is configured as a electrostatic chuck including electrodes embedded in the dielectric carrier plate and the interface layer comprises a semi-electrically conductive polymer film, and further comprising inducing an electrostatic attraction force between the dielectric carrier plate and the second layer prior to forming the one or more redistribution layers.

* * * * *

UNITED STATES PATENT AND TRADEMARK OFFICE
CERTIFICATE OF CORRECTION

PATENT NO. : 10,847,400 B2
APPLICATION NO. : 16/286273
DATED : November 24, 2020
INVENTOR(S) : Thirunavukarasu et al.

Page 1 of 1

It is certified that error appears in the above-identified patent and that said Letters Patent is hereby corrected as shown below:

In the Claims

Column 5, Line 37, in Claim 13, delete "polymer" and insert --first polymer--.

Column 6, Line 19, in Claim 18, delete "carder" and insert --carrier--.

Signed and Sealed this
Fifth Day of January, 2021

Andrei Iancu
*Director of the United States Patent and Trademark Office*